US009177685B1

(12) United States Patent
Wu et al.

(10) Patent No.: US 9,177,685 B1
(45) Date of Patent: Nov. 3, 2015

(54) HIGH POWER, BROADBAND TERAHERTZ, PHOTOCONDUCTIVE ANTENNAS WITH CHAOTIC SHAPE ELECTRODES

(71) Applicants: Dong Ho Wu, Olney, MD (US); Benjamin Graber, Washington, DC (US); Christopher Kim, Springfield, VA (US)

(72) Inventors: Dong Ho Wu, Olney, MD (US); Benjamin Graber, Washington, DC (US); Christopher Kim, Springfield, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 14/705,022

(22) Filed: May 6, 2015

Related U.S. Application Data

(60) Provisional application No. 61/988,968, filed on May 6, 2014.

(51) Int. Cl.
*H05G 2/00* (2006.01)
*G21K 5/02* (2006.01)
*H01S 1/02* (2006.01)

(52) U.S. Cl.
CPC .... *G21K 5/02* (2013.01); *H01S 1/02* (2013.01)

(58) Field of Classification Search
CPC .................................. G21K 5/02; H01S 1/02
USPC ............................... 250/493.1, 504 R; 372/4
See application file for complete search history.

(56) References Cited

U.S. PATENT DOCUMENTS

| 5,729,017 A * | 3/1998 | Brener et al. ............... 250/338.1 |
| 2006/0152412 A1* | 7/2006 | Evans et al. ............ 343/700 MS |
| 2007/0194253 A1* | 8/2007 | Nishizawa et al. ........ 250/493.1 |

OTHER PUBLICATIONS

"Coherent and incoherent terahertz beams measured from a terahertz photoconductive antenna," Dong Ho Wu, Benjamin Graber, Christopher Kim, S. B. Qadri, and Anthony Garzarella, Appl. Phys. Lett. 104, 051126 (Feb. 2014).
"Failure mechanism of THz GaAs photoconductive antenna," Syed B. Qadri, Dong H. Wu, Benjamin D. Graber, Nadeemullah A. Mahadik, and Anthony Garzarella, Appl. Phys. Lett. 101, 011910 (Jul. 2012).
"Dicke effect in a multi-ripple wave guide," H. Lee and L. E. Reichl, Phys. Rev. B 77 205318 (May 2008).
"Transient photoconductivity in GaAs as measured by time-resolved terahertz spectroscopy," Matthew C. Beard, Gordon M. Turner, and Charles A. Schmuttenmaer; Phys. Rev. B 62, 15764 (Dec. 2000).
"Ultrafast high-field carrier transport in GaAs measured by femtosecond pump-terahertz probe spectroscopy," Shi, Yulei, Zhou, Qing-li, Zhang, Cunlin, and Jin, Bin; Applied Physics Letters, 93, 121115 (Sep. 2008).

(Continued)

*Primary Examiner* — Michael Maskell
(74) *Attorney, Agent, or Firm* — US Naval Research Laboratory; Kerry L. Broome

(57) ABSTRACT

A photoconductive antenna is described that includes a substrate that includes a pair of trenches. Furthermore, a pair of non-parallel electrodes, which can be designed with a chaotic electrode geometry, can each be deposited in one of the trenches, and can be configured to produce chaotic trajectories of incoherent electric currents. Finally, an insulation layer, which can be either a physical electrical insulation layer or an air gap, can be included between each of the pair of non-parallel electrodes and the trench walls. Overall, the thickness of the substrate, the thickness of the trenches, and the thickness of the non-parallel electrodes can each be optimized to produce a coherent terahertz beam.

9 Claims, 14 Drawing Sheets

(56) References Cited

OTHER PUBLICATIONS

"Generation and detection of terahertz radiation up to 4.5 THz by low-temperature grown GaAs photoconductive antennas excited at 1560 nm," Rämer, Jan-Martin, Ospald, Frank, von Freymann, Georg, and Beigang, René; Applied Physics Letters, 103, 021119 (Jul. 2013).

"Cherenkov Radiation from Femtosecond Optical Pulses in Electro-Optic Media;" D. H. Auston, K. P. Cheung, J. A. Valdmanis, and D. A. Kleinman; Phys. Rev. Lett. 53, 1555; (Oct. 1984).

"Novel sources and detectors for coherent tunable narrow-band terahertz radiation in free space," Aniruddha S. Weling and David H. Auston, J. Opt. Soc. Am. B 13, 2783-2792 (Dec. 1996).

"Generation and detection of ultrabroadband terahertz radiation using photoconductive emitters and receivers," Shen, Y. C. Upadhya, P. C., Beere, H. E., Linfield, E. H., Davies, A. G., Gregory, I. S., Baker, C., Tribe, W. R. And Evans, M. J., Applied Physics Letters, 85, 164-166 (Jul. 2004).

"Significant performance enhancement in photoconductive terahertz optoelectronics by incorporating plasmonic contact electrodes," C.W. Berry, N. Wang, M.R. Hashemi, M. Unlu, and M. Jarrahi; Nat. Commun. 4, 1622 (Mar. 2013).

"Observation of Gigawatt-Class THz Pulses from a Compact Laser-Driven Particle Accelerator," A. Gopal, S. Herzer, A. Schmidt, P. Singh, A. Reinhard, W. Ziegler, D. Brömmel, A. Karmakar, P. Gibbon, U. Dillner, T. May, H-G. Meyer, and G. G. Paulus; Phys. Rev. Lett. 111, 074802 (Aug. 2013).

"Impulse response of photoconductors in transmission lines," Auston, D.H.; Quantum Electronics, IEEE Journal of, vol. 19, No. 4, pp. 639, 648 (Apr. 1983).

"Picosecond photoconducting Hertzian dipoles," Auston, D. H., Cheung, K. P., and Smith, P. R., Applied Physics Letters, 45, 284-286 (May 1984).

"Temperature dependence of femtosecond electromagnetic radiation from semiconductor surfaces," Hu, B. B., Zhang, X.-C., and Auston, D. H., Applied Physics Letters, 57, 2629-2631 (Dec. 1990).

"Tunable, continuous-wave Terahertz photomixer sources and applications," Preu, S., Döhler, G. H., Malzer, S., Wang, L. J., and Gossard, A. C., Journal of Applied Physics, 109, 061301 (Mar. 2011).

"Enhancement of the output power of a terahertz parametric oscillator with recycled pump beam," Wu, Dong Ho and Wan, Tomofumi, Applied Physics Letters, 95, 141105 (Oct. 2009).

"Failure mechanism of THz GaAs photoconductive antenna," Qadri, Syed B., Wu, Dong H., Graber, Benjamin D., Mahadik, Nadeemullah A., and Garzarella, Anthony, Applied Physics Letters, 101, 011910 (Jul. 2012).

"Highly tunable fiber-coupled photomixers with coherent terahertz output power," Verghese, S.; McIntosh, K.A.; Brown, E.R., Microwave Theory and Techniques, IEEE Transactions on, vol. 45, No. 8, pp. 1301, 1309 (Aug. 1997).

"GaAs under Intense Ultrafast Excitation: Response of the Dielectric Function," Li Huang, J. Paul Callan, Eli N. Glezer, and Eric Mazur, Phys. Rev. Lett. 80, 185 (Jan. 1998).

* cited by examiner

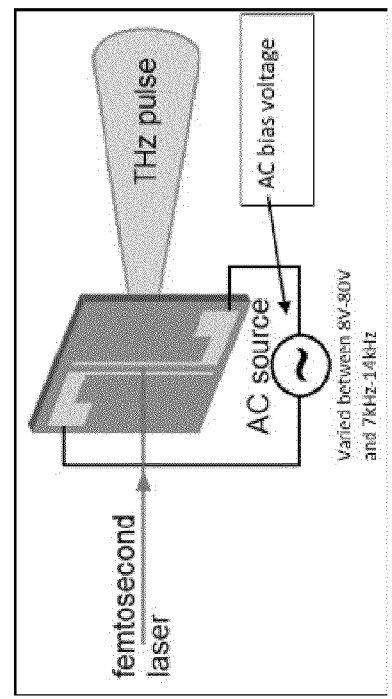
Figure 2A
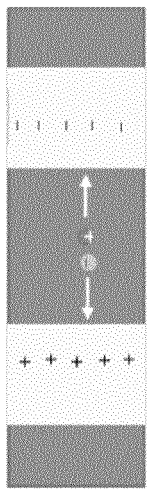
Figure 2(B1)
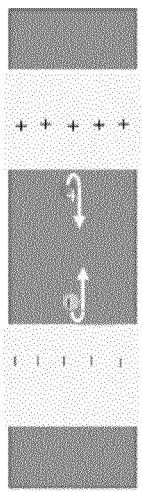
Figure 2(B2)
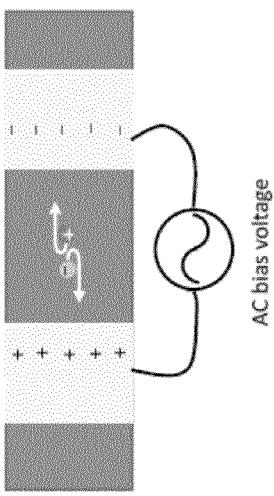
Figure 2(B3)
Figure 2B

PRIOR ART

HIGH POWER, BROADBAND TERAHERTZ, PHOTOCONDUCTIVE ANTENNAS WITH CHAOTIC SHAPE ELECTRODES

CROSS-REFERENCE TO RELATED APPLICATIONS

This application claims priority to provisional patent application entitled, "High Power, Broadband Terahertz, Photoconductive Antennas with Chaotic Shape Electrodes," filed on May 6, 2014, and assigned U.S. Application No. 61/988,968; the entire contents of which are hereby incorporated by reference.

FIELD OF THE INVENTION

The present disclosure relates generally to terahertz photoconductive antennas, and more specifically relates to optimizing a terahertz photoconductive antenna design to produce a strongly coherent terahertz beam.

BACKGROUND

Terahertz photoconductive antennas have been used for more than two decades. Since its invention in 1984, minor modifications have been made to the antenna structures; however, details of the antenna design and the parallel microstrip-line electrodes, which form the basic electrode structure of the conventional photoconductive antenna, have not been modified and are still being used.

FIG. 1 is a prior art terahertz photoconductive antenna structure 100. The parallel electrodes 105 are typically fabricated by depositing gold layers into two parallel trenches. Although the trench depth in FIG. 1 and the gold electrode thickness are labeled as 650 nm and 520 nm, the depth and thickness of the commercial photoconductive antennas have not been optimized, and there is no standard for these values. Therefore, it is not uncommon to see a large variation in these parameters from photoconductive-antenna manufacturers, and there are few guidelines for the fabrication of electrodes. The gold electrodes can often be excessively deposited, so that their thickness exceeds 1 µm. In commercial photoconductive antennas, the gold layers (electrodes) directly contact the trench walls, so that electric currents can flow from the electrode through the sidewall of the trench.

FIG. 2A is a prior art diagram representing the generation of a terahertz pulse using a femto-second laser and a photoconductive antenna. FIG. 2B is a prior art diagram representing the positive and negative charges between the electrodes during the generation of a terahertz pulse. FIG. 3 is a prior art diagram of a cross-sectional view of photoconductive antenna showing the photocurrents, bias currents and thermal currents during the generation of a terahertz pulse. FIGS. 2A and 3 illustrate that the terahertz pulse can be produced by illuminating a semiconductor slab (e.g., a GaAs substrate) with a femto-second laser beam. The laser pulse can generate a surface plasma, consisting of positive charges and negative charges. This oscillating surface plasma is known as a surface plasmon. The oscillating positive and negative charges can generate the terahertz pulse.

If the positive and negative charges recombine immediately after they are produced, the intensity of the terahertz pulse becomes very weak. Therefore, in order to minimize the charge recombination, a bias voltage can be applied to the electrodes, which can create an electric field that separates the positive charges from the negative charges (see FIG. 2(B1)). The positive charges will be attracted to the negative electrode, and the negative charges will be attracted to the positive electrode. However, when these charges arrive at the electrodes, they will ordinarily be discharged. To prevent such a discharge, the polarity of the electrodes can be switched right before the charges touch the electrodes, or just before they collide and recombine (see FIG. 2(B2) and FIG. 2(B3)). In other words, an AC bias voltage with an optimum frequency can substantially enhance the oscillation amplitude of the plasmon (the photocurrent) so that it increases the terahertz pulse strength.

The ac bias voltage, however, can result in substantial bias current flowing between the electrodes. This bias current, along with the photocurrent, can generate considerable Joule heating. The Joule heating, together with the thermal energy provided by the femto-second laser beam, can create thermal electric currents, which are incoherent in nature. The photocurrent, bias currents and thermal electric currents can all produce Joule heat, and the Joule heat can create more thermal currents, which can produce blackbody radiation, such as incoherent terahertz beams and infrared beams.

The thermal electric currents can also disrupt the coherency of the photocurrent and the bias currents, so that it reduces the strength of the coherent terahertz beam, and enhances the incoherent terahertz beam. This further increases the heating and the thermal electric currents. FIG. 4 is a prior art schematic diagram the explains how the photocurrent, bias-current, and thermal currents affect the production of a coherent terahertz beam and an incoherent terahertz beam. Specifically, FIG. 4 depicts the complex recursive process and the interactions among the three different currents. If the heat produced through this recursive process is excessive, it will eventually destroy the photoconductive antenna.

When a thermal electron (or electron wave function) travels perpendicular to the electrodes, in between a pair of parallel electrodes, the electron (or electron wave function) is likely to follow a bouncing ball trajectory or a standing wave pattern. FIG. 5A represents a bouncing ball trajectory for an electron wave function. FIG. 5B represents a standing wave pattern for an electron wave function. Therefore, the particle (the electron) or wave (the electron wave) is likely to be trapped in between the electrodes, unless the particle or wave travels at an oblique angle, such as in FIG. 6A and FIG. 7A. FIG. 6A represents a traveling ball mode trajectory for an electron wave function, and, similarly, FIG. 7A represents a non-chaotic trajectory, such as the traveling ball mode, for an electron wave function. Therefore, with the parallel electrode geometry, a large number of thermal electrons that flow incoherently can be trapped in between the electrodes and disrupt the photocurrent. FIG. 8A represents a slowly traveling, or virtually trapped, wave pattern for a traveling ball mode trajectory for an electron wave function.

Additionally, FIG. 6B represents a trapped ball mode trajectory for an electron wave function, and the associated FIG. 8B represents a standing wave mode for a trapped ball mode trajectory for an electron wave function. Similarly to FIG. 6A and associated FIG. 8A, FIG. 6B and FIG. 8B show how a large number of thermal electrons that flow incoherently can be trapped in between the electrodes and disrupt the photocurrent, and may not allow traveling wave pattern.

Consequently, a conventional photoconductive antenna with a pair of parallel electrodes is highly inefficient in converting the femto-second laser pulse into a terahertz beam; and, therefore, is not efficient in producing a strong, coherent terahertz beam. Instead, because of the above-mentioned problems, the antenna structure with the conventional electrodes predominantly produces incoherent terahertz beams, and the efficiency of the conventional photoconductive antenna is therefore very poor.

In summary, the conventional terahertz photoconductive antennas have the following limitations and disadvantages: (1) the design parameters, such as the trench depth, the thickness of the electrode, and the thickness of the substrate, are not optimized; (2) the conventional photoconductive antenna with a pair of parallel electrodes produces a very weak, coherent terahertz beam (<<1 mW); (3) with a strong pump-laser beam and a large bias voltage applied to the electrodes, they produce excessively incoherent terahertz beams, which lead to the destruction of the photoconductive antenna; and (4) as a result, the lifetime of the conventional photoconductive antenna is short.

Accordingly, there remains a need in the art for an improved design of a photoconductive antenna that can dramatically improve its conversion efficiency, and produce a strong, coherent terahertz beam.

SUMMARY OF THE INVENTION

According to one aspect of the invention, a photoconductive antenna is described that includes a substrate that includes a pair of trenches. Furthermore, a pair of non-parallel electrodes, which can be designed with a chaotic electrode geometry, can each be deposited in one of the trenches, and can be configured to produce chaotic trajectories of incoherent electric currents. Finally, an insulation layer, which can be either a physical electrical insulation layer or an air gap, can be included between each of the pair of non-parallel electrodes and the trench walls. Overall, the thickness of the substrate, the thickness of the trenches, and the thickness of the non-parallel electrodes can each be optimized to produce a coherent terahertz beam.

According to another aspect of the invention, a method is described for etching a pair of trenches into a substrate. Next, each one of a pair of non-parallel electrodes can be deposited into each of the pair of trenches in the substrate; wherein the pair of non-parallel electrodes can be configured to produce chaotic trajectories of incoherent electric currents. Finally, the pair of non-parallel electrodes can be configured to maintain an insulation layer between each of the pair of non-parallel electrodes and the trench walls. Furthermore, the thickness of the substrate, the thickness of the trenches, and the thickness of the non-parallel electrodes can be optimized to produce a coherent terahertz beam.

These and other aspects, objects, and features of the present invention will become apparent from the following detailed description of the exemplary embodiments, read in conjunction with, and reference to, the accompanying drawings.

BRIEF DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description of the disclosure when considered in conjunction with the drawings, in which:

FIG. 2A is a prior art diagram representing the generation of a terahertz pulse using a femto-second laser and a photoconductive antenna.

FIG. 2B is a prior art diagram representing the positive and negative charges between the electrodes during the generation of a terahertz pulse.

DETAILED DESCRIPTION OF EXEMPLARY EMBODIMENTS

Figure 1:
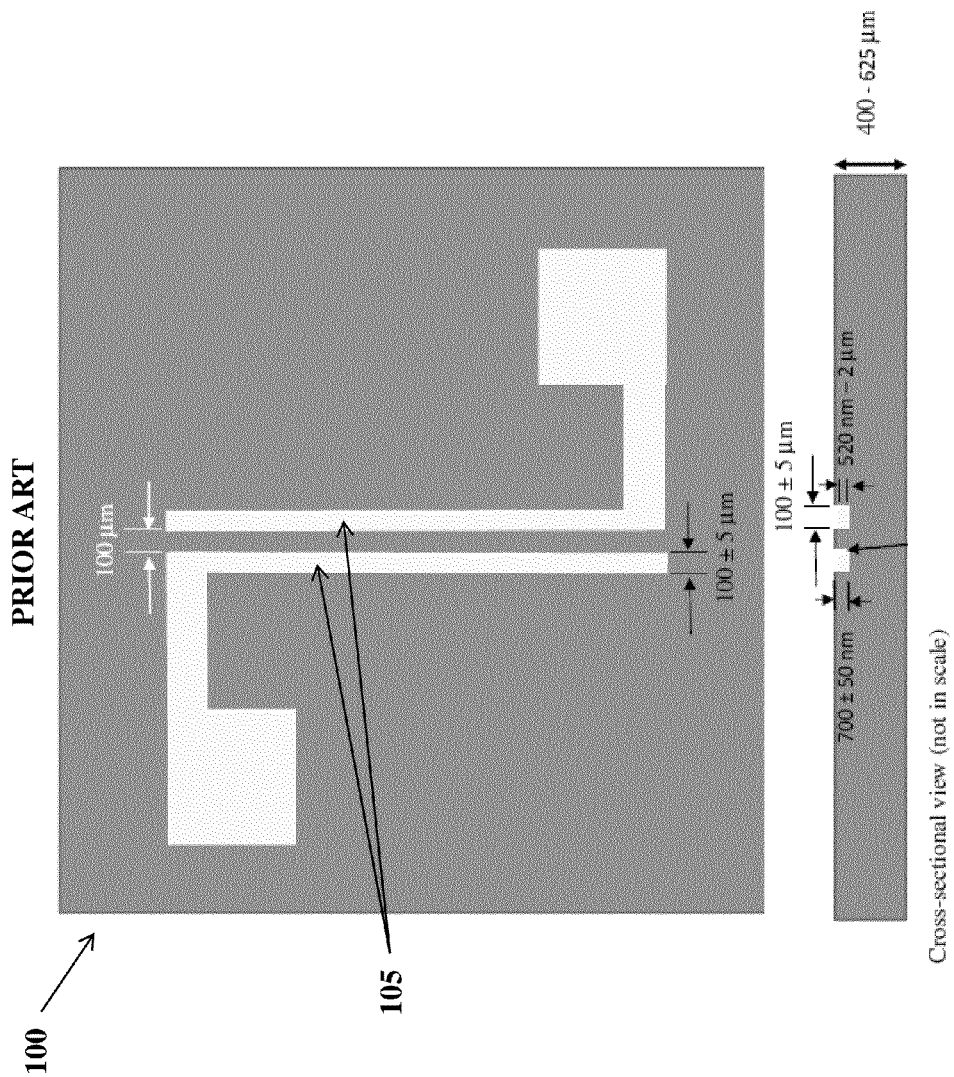
FIG. 1 is a prior art terahertz photoconductive antenna structure.
Figure 3:
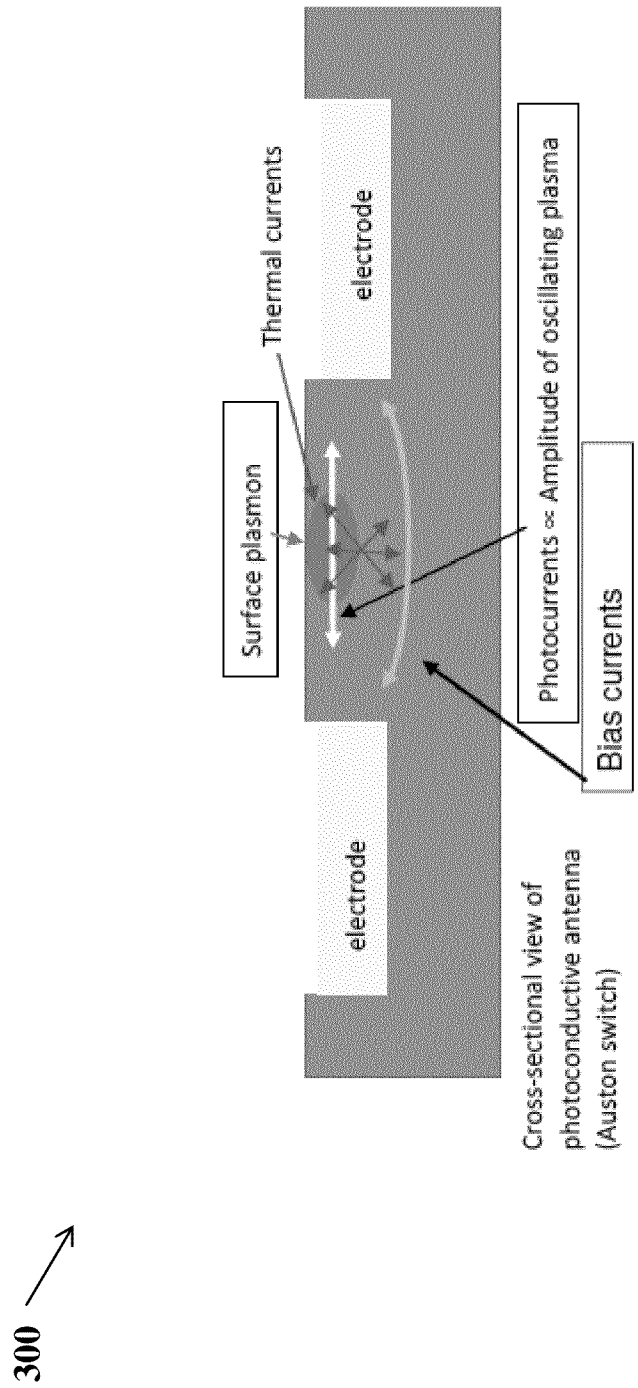
FIG. 3 is a prior art diagram of a cross-sectional view of photoconductive antenna showing the photocurrents, bias currents and thermal currents during the generation of a terahertz pulse.

One or more embodiments or implementations are hereinafter described in conjunction with the drawings, where like reference numerals refer to like elements throughout, and where the various features are not necessarily drawn to scale.

As mentioned in the background section, the inefficiency of the conventional photoconductive antenna stems from the thermal electric currents, which are produced by both the thermal load of the femto-second laser beam and the electric currents, including the photocurrent, the bias current and the thermal electric current itself. It is also understood that the behavior of the thermal electric currents (and the heat production associated with these currents) is closely related with the electrodes. For example, by altering the design of the electrodes, one can suppress the production of thermal electrons, and minimize the disruption of the photocurrents by the thermal currents.

Accordingly, to improve the terahertz photoconductive antenna, the electrode design can be changed. First, a pair of trenches can be etched into a substrate. Then, in an exemplary embodiment of the invention, the electrode design of the terahertz photoconductive antenna can include two electrodes that are not parallel, instead of two parallel micro-stripline electrodes. Each one of the pair of non-parallel electrodes can be separately deposited into each of the pair of trenches in the substrate. That is, one electrode can go in one trench, and the other electrode can go in the other trench. Finally, the pair of non-parallel electrodes can be configured in the trenches to maintain an insulation layer, which can include either depositing a physical electrical insulation layer between each of the pair of non-parallel electrodes and the trench walls, or maintaining an air gap between each of the pair of non-parallel electrodes and the trench walls.

Figure 6B:
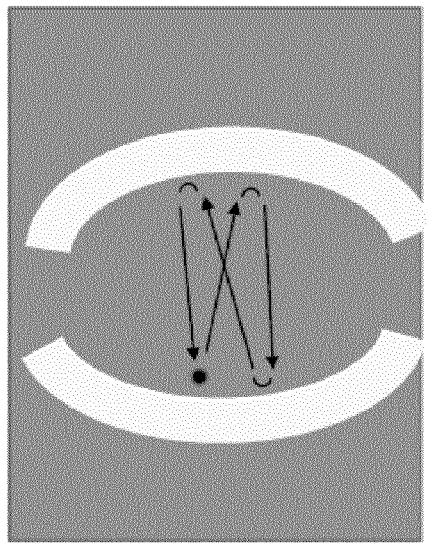
FIG. 6B represents a trapped ball mode trajectory for an electron wave function.
Figure 6C:
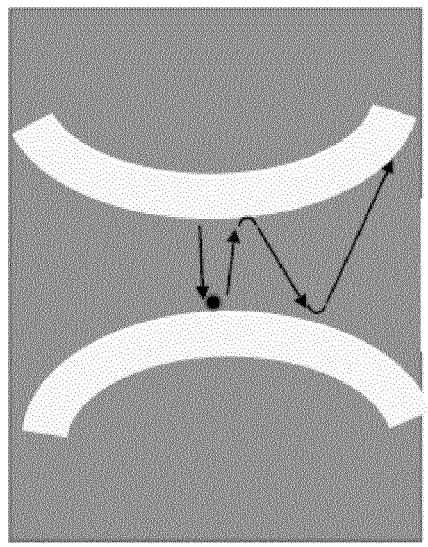
FIG. 6C represents a rapidly diverging ball mode trajectory for an electron wave function.
Figure 6A:
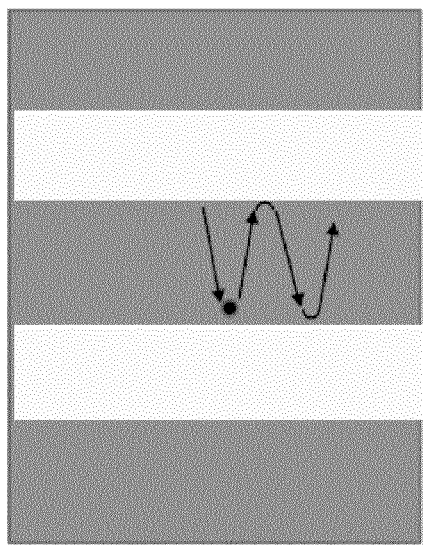
FIG. 6A represents a traveling ball mode trajectory for an electron wave function.
Figure 7A:
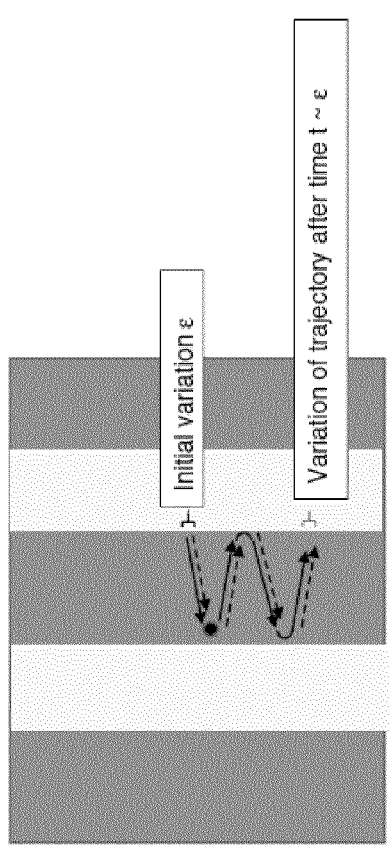
FIG. 7A represents a non-chaotic trajectory for an electron wave function.
Figure 7B:
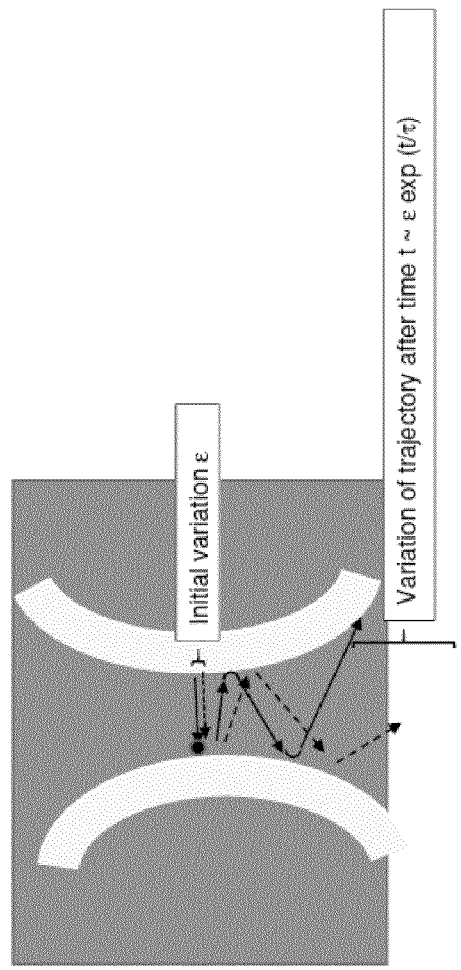
FIG. 7B represents a chaotic trajectory for an electron wave function, in accordance with an exemplary embodiment of the invention.
Figure 8A:
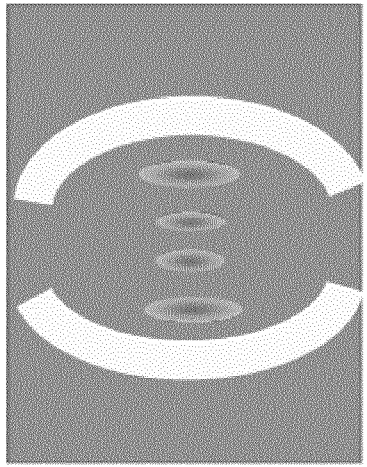
FIG. 8A represents a slowly traveling, or virtually trapped, wave pattern for a traveling ball mode trajectory for an electron wave function.
Figure 8B:
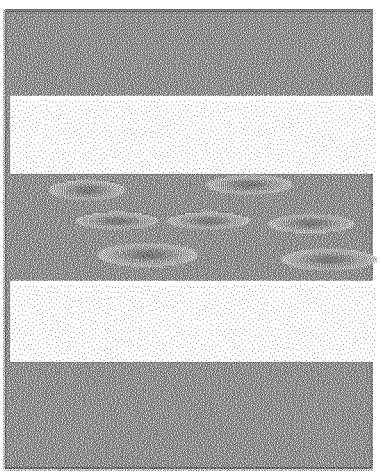
FIG. 8B represents a standing wave mode for a trapped ball mode trajectory for an electron wave function.
Figure 8C:
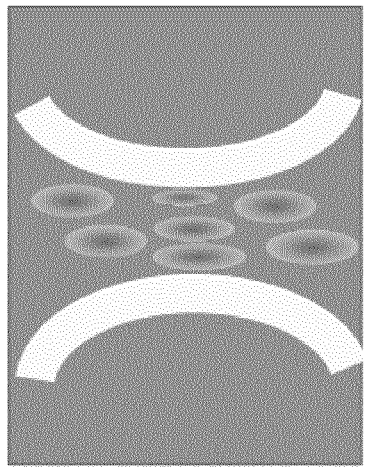
FIG. 8C represents a rapidly diverging wave pattern for a rapidly diverging ball mode trajectory for an electron wave function.

Several different, non-parallel shapes can be used in the design for the electrodes, and these shapes can be called "chaotic geometries" since, in contrast to a pair of parallel electrodes, these electrodes are configured to produce chaotic trajectories when a particle or wave bounces between the electrodes. The chaotic trajectory means that with a minute variation of the initial condition, the trajectory deviates, or varies, exponentially with time. FIG. 7B represents a chaotic trajectory for an electron wave function. In particular, FIG. 6C represents a rapidly diverging ball mode trajectory for an electron wave function, which represents an example of a chaotic trajectory. In association, FIG. 8C represents a rapidly diverging wave pattern for a rapidly diverging ball mode trajectory for an electron wave function.

Figure 4:
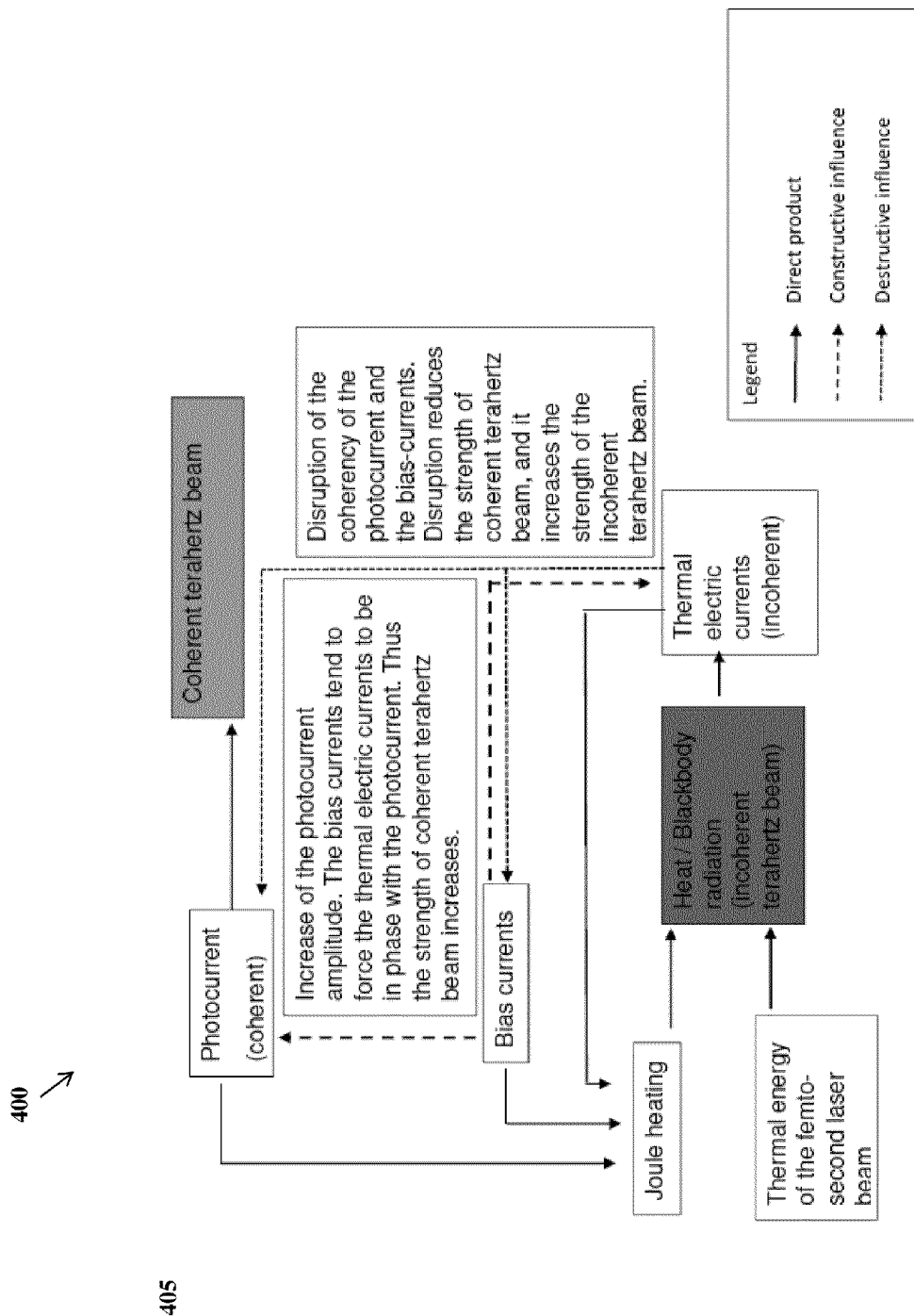
FIG. 4 is a prior art schematic diagram that explains how the photocurrent, bias-current, and thermal currents affect the production of a coherent terahertz beam and an incoherent terahertz beam.
Figure 5A:
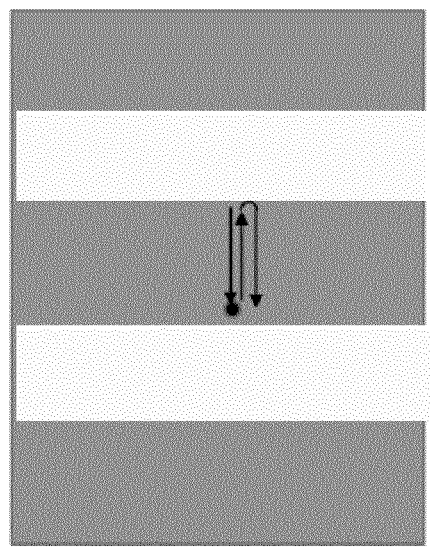
FIG. 5A represents a bouncing ball trajectory for an electron wave function.
Figure 5B:
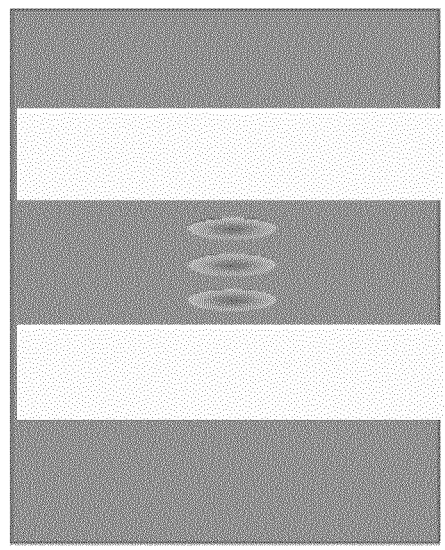
FIG. 5B represents a standing wave pattern for an electron wave function.

As explained in the background section with respect to the prior art schematic diagram in FIG. 4, there are three electric currents in a photoconductive antenna: the photocurrent, the bias currents and the thermal electric currents. These three currents interact with each other, either constructively or destructively. For example, the bias currents (or the electric field produced by the bias voltage) force the thermal electric currents to be in phase with the photocurrent, so that they can produce more of a coherent terahertz beam. However, the thermal electric currents tend to disrupt the coherency of the photocurrent and the bias currents, so that the strength of coherent terahertz beam is reduced and the strength of incoherent terahertz beam is increased.

In an exemplary embodiment of the invention, in a photoconductive antenna with a pair of chaotic electrodes, incoherent electric currents (e.g., thermal electric currents) normally follow chaotic trajectories, and their interference with the coherent electric currents become minimized. Therefore, it will promote some bias currents and some thermal electric currents to flow in phase with the coherent photocurrent, which can allow the photoconductive antenna to produce a stronger coherent terahertz beam.

Figure 9:
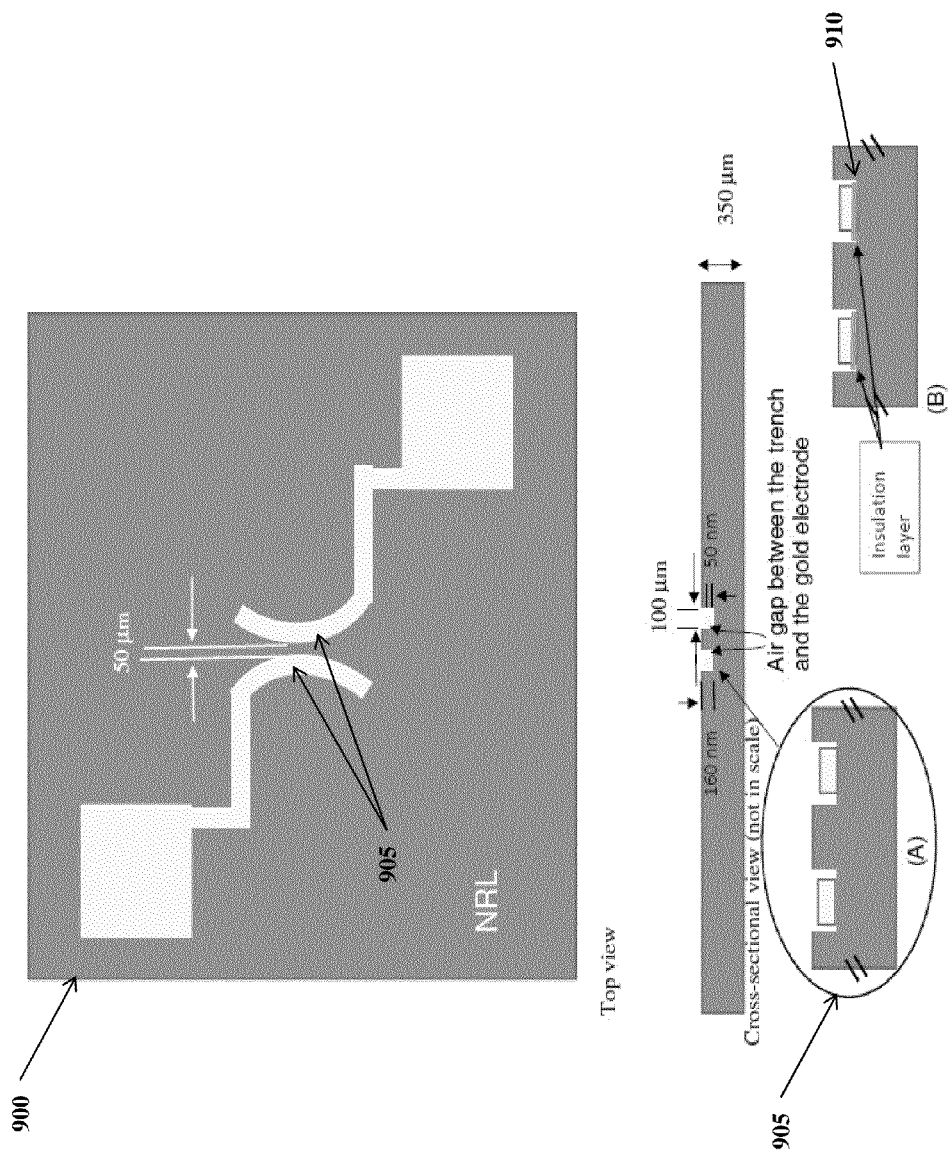
FIG. 9 is a photoconductive antenna with a pair of chaotic electrodes, in accordance with an exemplary embodiment of the invention.
Figure 10:
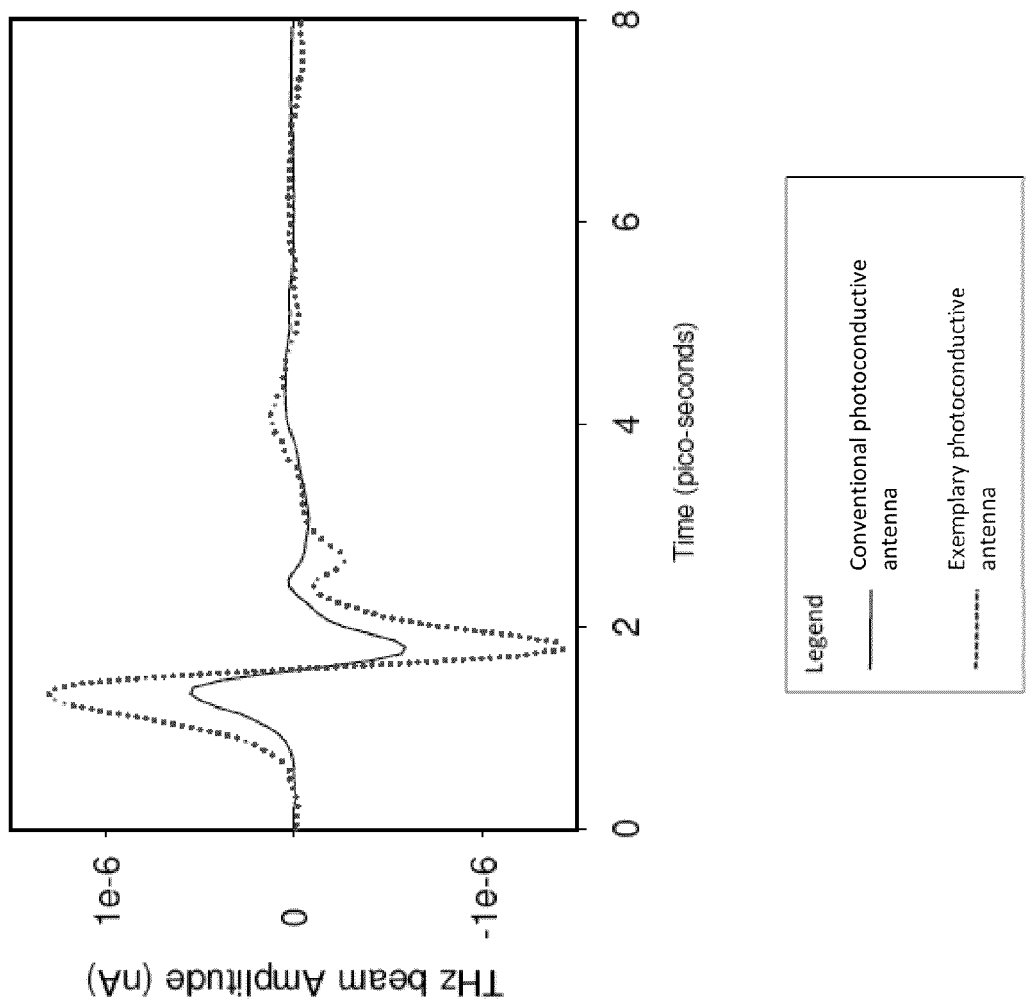
FIG. 10 is a graph comparing time domain signals from a conventional THz emitter and THz emitter in accordance with an exemplary embodiment of the invention.

In an exemplary embodiment of the invention, several different chaotic electrode geometries can be utilized. FIG. 9 is a photoconductive antenna 900 with a pair of chaotic electrodes 905, in accordance with an exemplary embodiment of the invention. Specifically, the chaotic electrodes in FIG. 9 represent an hourglass shape geometry that leads to chaotic trajectories (as also seen in FIG. 7B). FIG. 10 is a graph comparing time domain signals from a conventional THz emitter and THz emitter in accordance with an exemplary embodiment of the invention. Specifically, FIG. 10 is a graph of time domain signals from a conventional THz emitter with a conventional photoconductive antenna with a pair of parallel electrode (solid line) and an exemplary THz emitter with an exemplary photoconductive antenna with a pair of chaotic electrode (dotted line). Note that the exemplary THz emitter can produce a much greater coherent THz output (i.e., at least 3 mW THz output). Furthermore, the terahertz spectrum of the exemplary photoconductive antenna is nearly identical to that of the conventional photoconductive antenna, even while producing the much greater and more coherent THz output.

Figure 11:
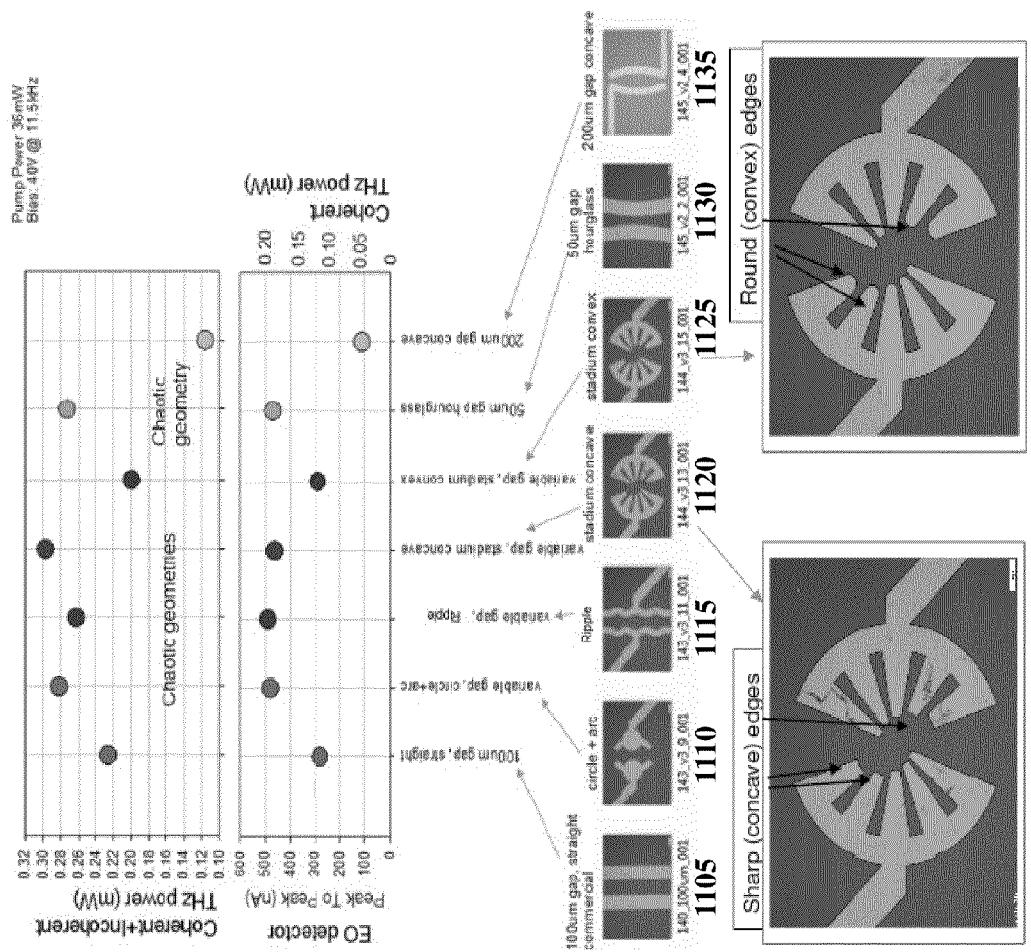
FIG. 11 is a chart of sample results obtained from photoconductive antennas with various geometries in accordance with an exemplary embodiment of the invention.

FIG. 11 is a chart of sample results obtained from photoconductive antennas with various geometries in accordance with an exemplary embodiment of the invention. Four antennas containing chaotic electrodes (i.e., circle plus arc electrode geometry 1110; a ripple electrode geometry 1115; a stadium concave geometry 1120; or a hourglass geometry 1130) produce much stronger terahertz beams when compared with three antennas with non-chaotic electrodes (i.e., a conventional parallel geometry 1105, a stadium convex geometry 1125, and a gap concave geometry 1135). Interestingly, drastically different results can be obtained from two antennas, stadium concave 1120 and stadium convex 1125, that look very similar to each other, except one, stadium concave 1120, has sharp edges and the other, stadium convex 1125, has round and smooth edges. The antenna with the stadium concave 1120 chaotic geometry leads to chaotic electron trajectories because its sharp edges reflect the electrons and do not allow them to enter into the slits.

Figure 12A:
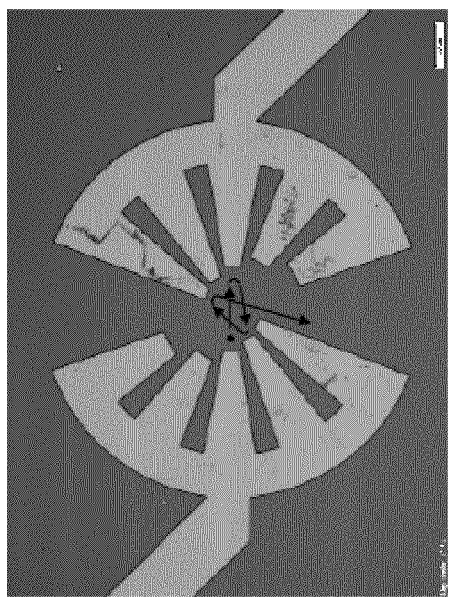
FIG. 12A is an example view of thermal electron behavior in a stadium concave geometry, in accordance with an exemplary embodiment of the invention.

FIG. 12A is an example view of thermal electron behavior in a stadium concave geometry, in accordance with an exemplary embodiment of the invention. The sharp edges of the stadium concave 1120 geometry force the electrons to follow spiral trajectories, as represented in FIG. 12A. Most thermal electrons reflected by the concave geometry follow chaotic trajectories, and diverge away from the emitter so that they minimally interfere with the photocurrent. Therefore, this emitter produces a relatively stronger terahertz beam.

Figure 12B:
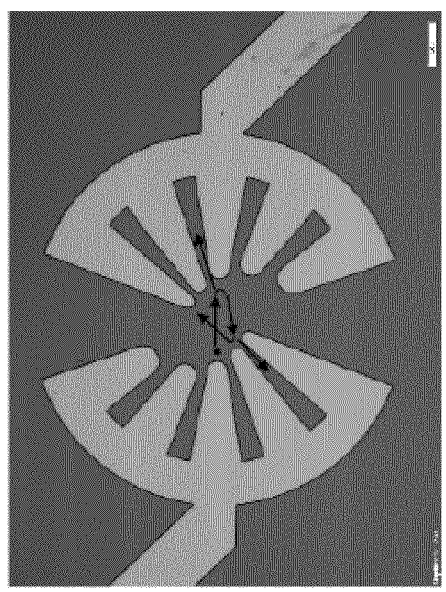
FIG. 12B is an example view of thermal electron behavior in a stadium convex geometry, in accordance with an exemplary embodiment of the invention.

By contrast, the smooth edges of the antenna with the stadium convex 1125 geometry make the electrons enter the slits, so that the electrons can eventually be trapped in the slits. FIG. 12B is an example view of thermal electron behavior in a stadium convex geometry, in accordance with an exemplary embodiment of the invention. These trapped electrons release their energy as heat, which disrupts the coherent electron currents and hence reduces the coherent terahertz beam output. Although the shape of the electrodes in FIG. 12B look similar to that of FIG. 12A, because of the convex tip of the electrodes, the thermal electrons tend to be trapped in the gaps between the electrodes. Consequently, they create more heat and disturb the photocurrent. Therefore, this emitter is inefficient and produces a weak terahertz beam. FIGS. 12A and 12B are included here to illustrate how the thermal electron behavior affects the performance of a terahertz emitter.

Figure 13:
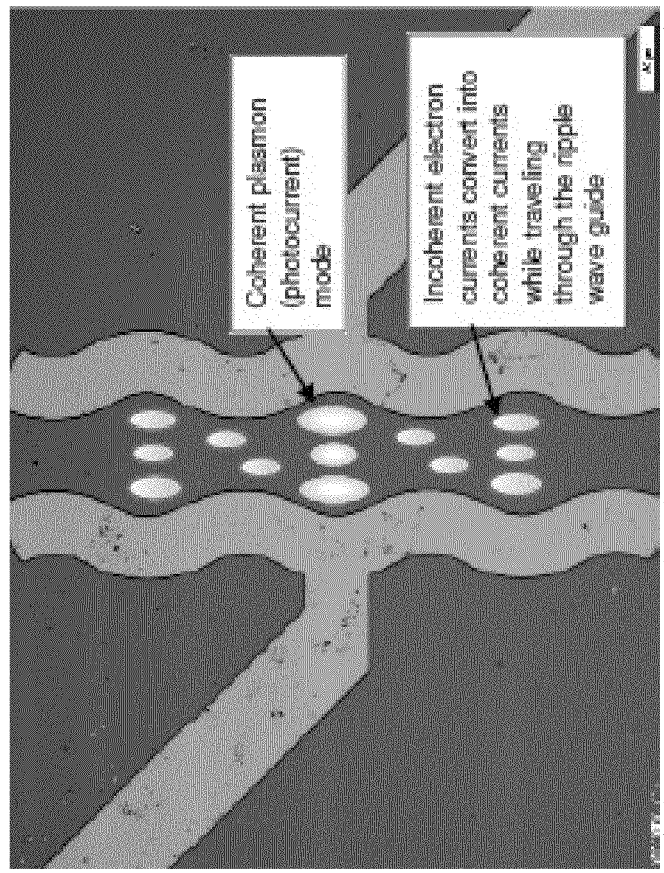
FIG. 13 is a graphic of how a ripple electrode geometry produces a more coherent terahertz beam, in accordance with an exemplary embodiment of the invention.

In an exemplary embodiment of the invention, a photoconductive antenna with a ripple chaotic electrode geometry can be the most efficient. The ripple chaotic electrode geometry includes a pair of wavy electrodes at a variable distance apart. The ratio of the coherent terahertz power to the total (coherent and incoherent) terahertz power for the ripple geometry is about 73% for the antenna. This is because a pair of ripple electrodes leads to chaotic electron trajectories. Furthermore, ripple electrodes not only minimize the interference between the incoherent electron currents and coherent currents, but also convert the incoherent electron currents into coherent currents, further amplifying the coherent electron currents, which produce a more coherent terahertz beam. FIG. 13 is a graphic of how a ripple electrode geometry produces a more coherent terahertz beam, in accordance with an exemplary embodiment of the invention.

In addition to altering the shapes of the electrodes as described above, the electrodes of the photoconductive antennas can be electrically insulated from the trench walls by air-gaps or by an electrical insulation layer, in accordance with an exemplary embodiment of the invention. FIG. 9 shows electrodes of the photoconductive antennas can be electrically insulated from the trench walls by air-gaps 905 or by an electrical insulation layer 910. With this electrical insulation, the electrodes can generate an electric field with a minimal bias current flowing between the electrodes. This exemplary photoconductive antenna can significantly reduce Joule heating; and, therefore, the thermal electrical currents, which can disrupt the coherent photocurrent. As a result, the exemplary photoconductive antenna can generate more of a coherent terahertz beam, and the incoherent terahertz-beam generation is considerably suppressed. In an exemplary embodiment of the invention, silicon-nitride (SiN) has been used as the material for an electrical insulation layer; however, one of ordinary skill in the art recognizes that other materials can be used as well.

For high-efficiency terahertz emission, the surface plasmon (the photocurrent) that produces the terahertz pulse should be generated at an optimum depth from the surface of the photoconductive antenna. Therefore, the depth of the electrodes that control the surface plasmon should be accordingly configured and optimized. In other words, the trench depth and the electrode thickness should be configured and optimized so that the surface plasmon is confined at the optimum depth from the surface. The depth of confinement is dependent on the electron mobility and the surface energy. If the trench depth is too deep or too shallow, and the thickness of the electrode is too thick or too shallow, they cannot control the surface plasmon effectively.

In addition, in an exemplary embodiment of the invention, a photoconductive antenna can use an optimum thickness of the GaAs substrate, so that the terahertz pulse can transmit through the GaAs substrate without suffering much transmission loss. If the GaAs substrate thickness is too thin, the femto-second laser beam will be able to penetrate through the substrate and deposit too much thermal energy onto the substrate, which eventually will lead to thermal damage to the substrate and destroy the photoconductive antenna. If the GaAs substrate is too thick, the terahertz beam will experience significant dissipation while passing through the substrate. To meet these design considerations the thickness of GaAs substrate, the trench depth of the electrodes, and the thickness of the gold electrodes for the exemplary photoconductive antenna is optimized.

Figure 14:
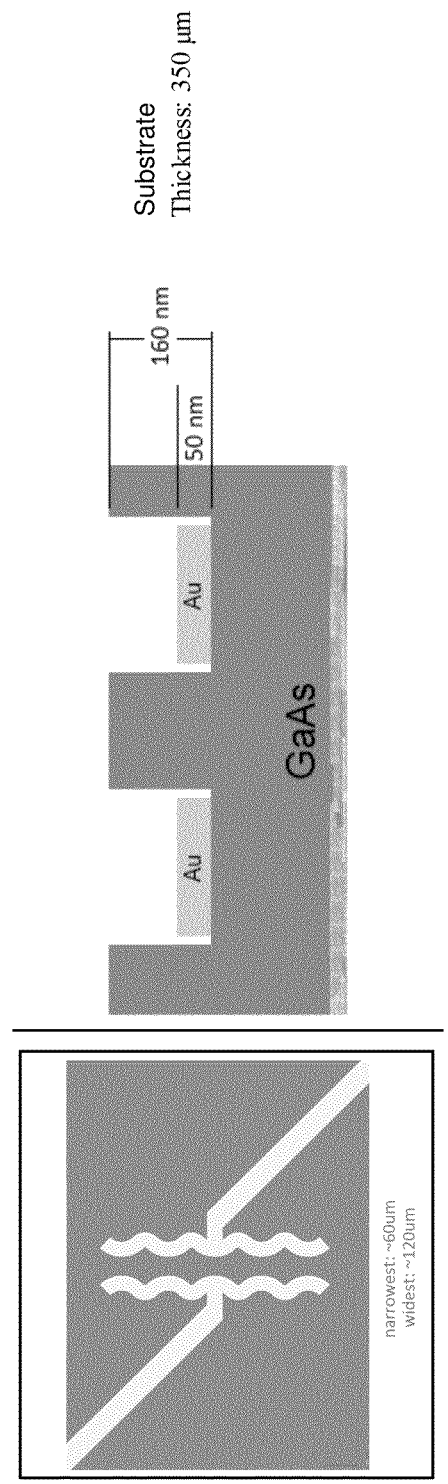
FIG. 14 is an example of an optimally configured photoconductive antenna, in accordance with an exemplary embodiment of the invention.

As noted, configuring an exemplary photoconductive antenna for an optimum depth of trench, optimum thickness of electrode, optimum thickness of the substrate is an important feature of the invention. FIG. 14 is an example of an optimally configured photoconductive antenna, in accordance with an exemplary embodiment of the invention. Specifically, the exemplary photoconductive antenna can be designed with a ripple electrode geometry with a substrate thickness of about 350 μm; a trench depth of about 160 nm; and an electrode thickness of about 50 nm. One of ordinary skill in the art will understand that these different parameters are just examples of an optimized exemplary photoconductive antenna, and values greater than or less than the values disclosed above can be utilized. Furthermore, the exemplary photoconductive antenna can include an air-gap between the electrode and the trench walls. The exemplary combination of features and parameters can produce a terahertz beam of at least 3 mW (average power), which is about 20-30 times stronger than the maximum average power a conventional terahertz emitter can currently produce.

In an exemplary embodiment of the invention, the exemplary terahertz photoconductive antennas described herein can be used for terahertz spectroscopy and imaging, which can enable new applications that were nearly impossible previously. Examples of these applications include detection and identification of biological and chemical agents, detection of hidden explosives, and detection and identification of environmental contaminants at a standoff distance. Another application currently being researched is to use the terahertz spectrometer to detect ionized air produced by a hidden nuclear material.

In addition to the applications discussed above, prototype devices for pharmaceutical applications in a real environment have been developed to see if terahertz spectrometers and terahertz imaging devices are able to screen for counterfeit drugs. The prototype device that consists of a conveyer belt, robotic arms, and a high-speed terahertz spectrometer can measure the terahertz spectrum of an unknown drug in order to determine whether its spectrum matches that of a legitimate drug. If the spectrum does not match, the robotic arm can reject the drug.

As noted herein, the maximum terahertz beam power produced by prior art photoconductive antennas is limited. A weak terahertz beam affects the spectroscopic resolution, the detection range, and the detection speed. Accordingly, it is imperative to increase the coherent terahertz-beam output for the above-mentioned applications.

One of ordinary skill in the art will understand that certain changes may be made to embodiments of the invention without departing from the scope and spirit of the invention. For example, while a GaAs substrate for the demonstration of the exemplary photoconductive antenna is described herein, other substrate materials for the photoconductive antenna can also be used. The electrode gap size can be in the range from a few tens of micrometers to a few hundred micrometers. The electrodes can be made of other metals than gold. The photoconductive antenna is described as a transmission mode terahertz emitter herein; however, one can slightly alter the design to demonstrate a reflection mode terahertz emitter.

In summary, the exemplary photoconductive antenna described herein does not produce much bias current or Joule heat; therefore, it can produce a strongly coherent terahertz beam. The exemplary photoconductive antenna can produce at least 3 mW of coherent terahertz radiation, whereas prior art photoconductive antennas could generate at best only 0.16 mW of coherent terahertz radiation. Furthermore, the exemplary photoconductive antenna can produce a wider bandwidth (i.e., 100 GHz to 3 THz) and a predominantly coherent terahertz beam. In addition, the lifetime of the exemplary photoconductive antenna is much longer than that of prior art versions. Overall, the features of the exemplary photoconductive antenna include (1) a pair of electrodes that lead to chaotic trajectories of incoherent electric currents, (2) an insulating layer, or air-gap, between the electrode and the trench walls, (3) optimum depth of trench, (4) optimum thickness of electrode, (5) optimum thickness of the substrate.

It should be understood that the foregoing relates only to illustrative embodiments of the present invention, and that numerous changes may be made therein without departing from the scope and spirit of the invention as defined by the following claims.

The invention claimed is:

1. A photoconductive antenna; comprising:
a substrate comprising a pair of trenches;
a pair of non-parallel electrodes each deposited in one of the trenches, and configured to produce chaotic trajectories of incoherent electric currents; and
an insulation layer between each of the pair of non-parallel electrodes and the trench walls.

2. The photoconductive antenna of claim 1, wherein a thickness of the substrate, a thickness of the trenches, and a thickness of the non-parallel electrodes are each optimized to produce a coherent terahertz beam.

3. The photoconductive antenna of claim 1, wherein the pair of non-parallel electrodes each comprise a chaotic electrode geometry.

4. The photoconductive antenna of claim 3, wherein the chaotic electrode geometries comprise one of a circle plus arc electrode geometry; a ripple electrode geometry; a stadium concave geometry; or a hourglass geometry.

5. The photoconductive antenna of claim 1, wherein the insulation layer comprises at least one of a physical electrical insulation layer or an air gap.

6. A method, comprising the steps of:
etching a pair of trenches into a substrate;
depositing each one of a pair of non-parallel electrodes into each of the pair of trenches in the substrate; wherein the pair of non-parallel electrodes are configured to produce chaotic trajectories of incoherent electric currents; and
configuring the pair of non-parallel electrodes to maintain an insulation layer between each of the pair of non-parallel electrodes and the trench walls.

7. The method of claim 6, further comprising optimizing a thickness of the substrate, a thickness of the trenches, and a thickness of the non-parallel electrodes to produce a coherent terahertz beam.

8. The method of claim 6, wherein configuring the pair of non-parallel electrodes to maintain an insulation layer, comprises depositing a physical electrical insulation layer between each of the pair of non-parallel electrodes and the trench walls.

9. The method of claim 6, wherein configuring the pair of non-parallel electrodes to maintain an insulation layer, comprises maintaining an air gap between each of the pair of non-parallel electrodes and the trench walls.

* * * * *